United States Patent
Sei et al.

(10) Patent No.: US 9,466,791 B2
(45) Date of Patent: Oct. 11, 2016

(54) STORAGE DEVICE AND STORAGE UNIT

(71) Applicant: Sony Corporation, Tokyo (JP)

(72) Inventors: Hiroaki Sei, Kanagawa (JP); Kazuhiro Ohba, Tokyo (JP); Takeyuki Sone, Kanagawa (JP); Minoru Ikarashi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/848,996

(22) Filed: Mar. 22, 2013

(65) Prior Publication Data

US 2013/0256622 A1 Oct. 3, 2013

(30) Foreign Application Priority Data

Mar. 30, 2012 (JP) ................ 2012-080643

(51) Int. Cl.
*H01L 45/00* (2006.01)
*G11C 13/00* (2006.01)
*H01L 27/24* (2006.01)

(52) U.S. Cl.
CPC .......... *H01L 45/08* (2013.01); *G11C 13/0002* (2013.01); *G11C 13/0007* (2013.01); *G11C 13/0011* (2013.01); *H01L 27/2436* (2013.01); *H01L 27/2472* (2013.01); *H01L 45/1233* (2013.01); *H01L 45/145* (2013.01); *H01L 45/146* (2013.01)

(58) Field of Classification Search
CPC ................................ H01L 45/00; H01L 45/08
USPC ................. 257/4, E45.002, E47.001
See application file for complete search history.

(56) References Cited

U.S. PATENT DOCUMENTS

| | | | |
|---|---|---|---|
| 2009/0039337 A1* | 2/2009 | Ohba et al. | 257/4 |
| 2009/0173930 A1* | 7/2009 | Yasuda et al. | 257/4 |
| 2010/0108972 A1* | 5/2010 | Zhao et al. | 257/2 |
| 2011/0194329 A1* | 8/2011 | Ohba et al. | 365/148 |

FOREIGN PATENT DOCUMENTS

| | | |
|---|---|---|
| JP | 2006-196537 A | 7/2006 |
| JP | 2009-043758 A | 2/2009 |
| JP | 2009-164467 A | 7/2009 |
| JP | 2011-187925 A | 9/2011 |

OTHER PUBLICATIONS

Japanese Office Action for Japanese Application No. 2012-080643 issued Dec. 22, 2015.
Office Action received for Japanese Patent Application No. 2012-080643, mailed on Jun. 17, 2016, pp. 4.
Office Action recieved for Chinese Patent Application No. 201310093311.2, mailed on Jul. 6, 2016, 14 pages of Office Action including 8 pages of English translation.

* cited by examiner

*Primary Examiner* — Sheng Zhu
(74) *Attorney, Agent, or Firm* — Chip Law Group

(57) ABSTRACT

A storage device includes: a first electrode; a storage layer including an ion source layer; and a second electrode. The first electrode, the storage layer, and the second electrode are provided in this order. The ion source layer includes a chalcogen element, oxygen, and one or more transition metal elements selected from the group of Groups 4, 5, and 6 elements of the Periodic Table.

12 Claims, 13 Drawing Sheets

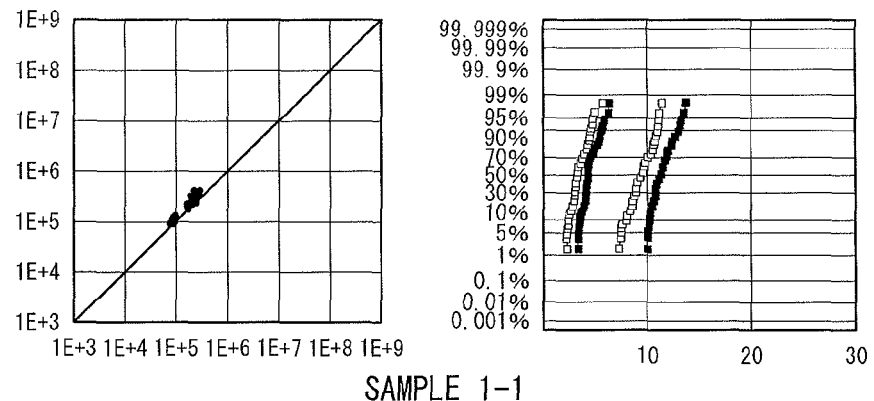
FIG. 4A SAMPLE 1-1
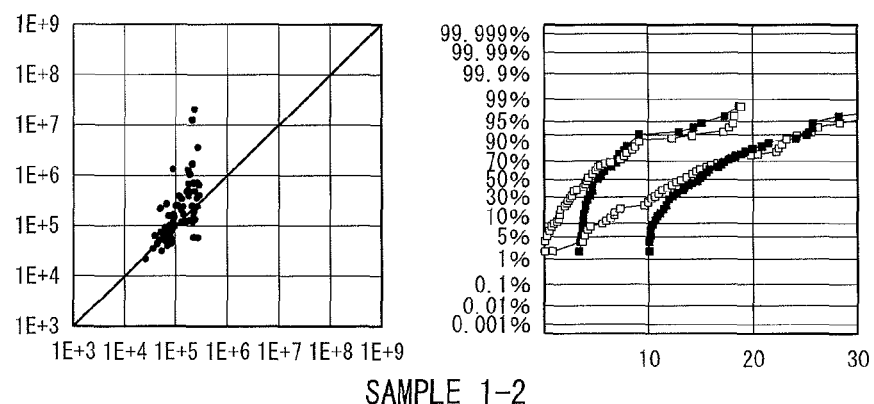
FIG. 4B SAMPLE 1-2
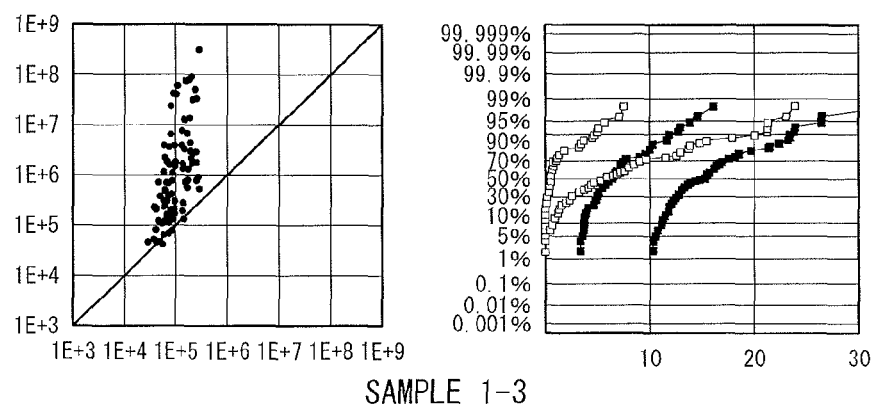
FIG. 4C SAMPLE 1-3

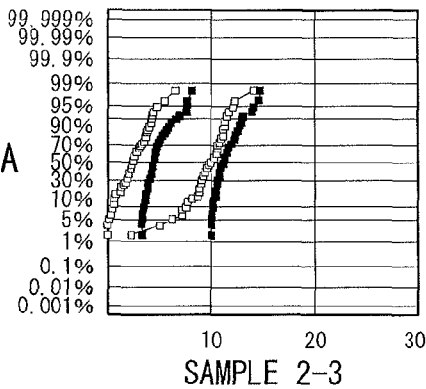
FIG. 6A SAMPLE 2-3
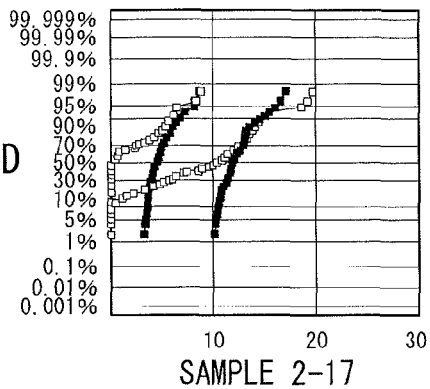
FIG. 6D SAMPLE 2-17
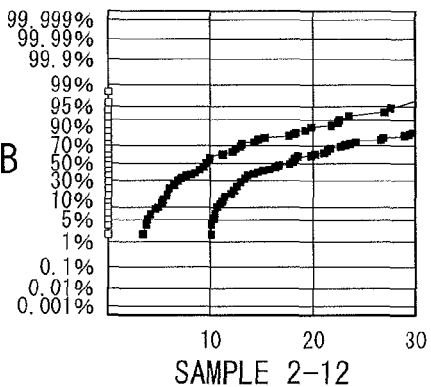
FIG. 6B SAMPLE 2-12
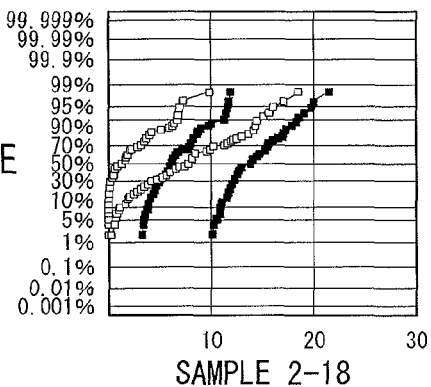
FIG. 6E SAMPLE 2-18
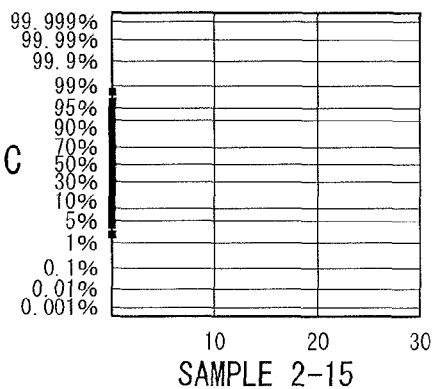
FIG. 6C SAMPLE 2-15
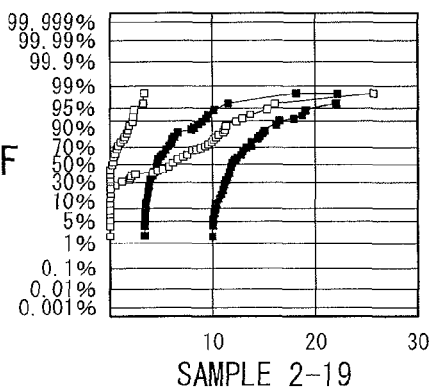
FIG. 6F SAMPLE 2-19

SAMPLE 2-18

SAMPLE 2-19

SAMPLE 3-1

SAMPLE 3-2

SAMPLE 3-3

SAMPLE 3-4

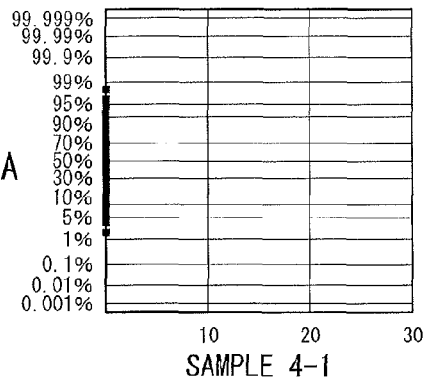
FIG. 10A SAMPLE 4-1
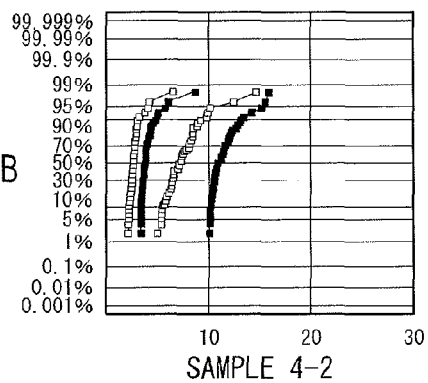
FIG. 10B SAMPLE 4-2
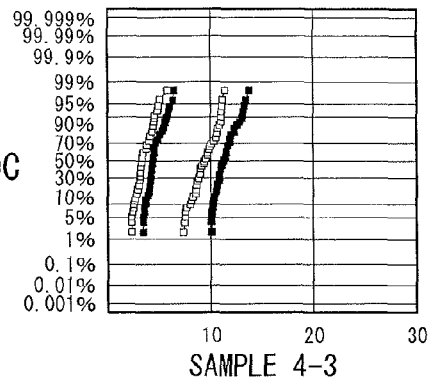
FIG. 10C SAMPLE 4-3
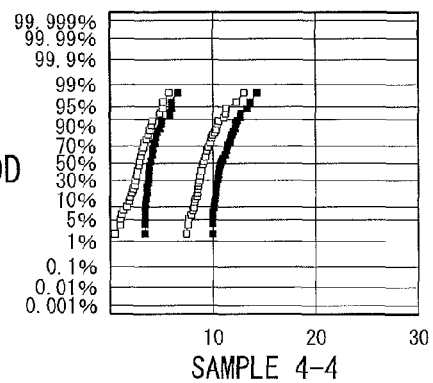
FIG. 10D SAMPLE 4-4
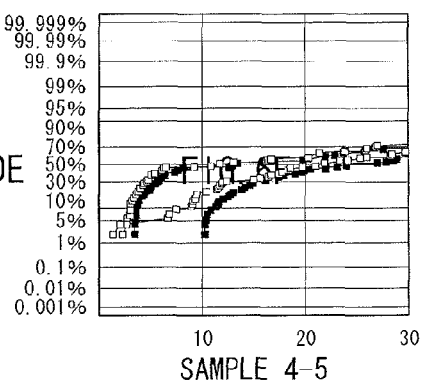
FIG. 10E SAMPLE 4-5

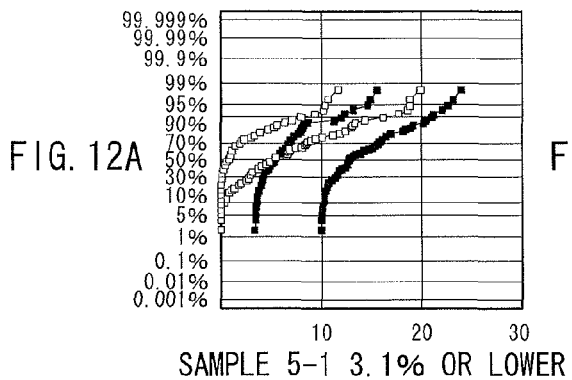
FIG. 12A SAMPLE 5-1 3.1% OR LOWER
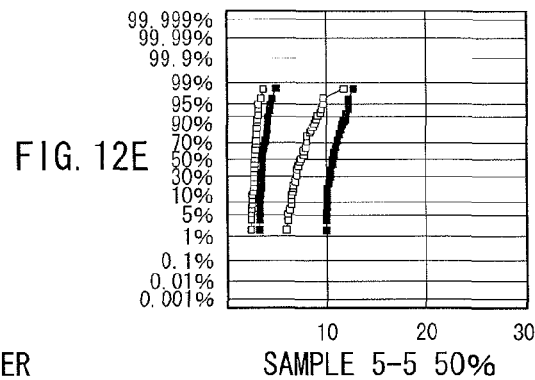
FIG. 12E SAMPLE 5-5 50%
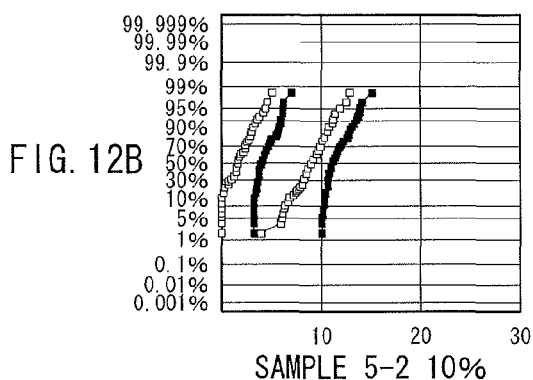
FIG. 12B SAMPLE 5-2 10%
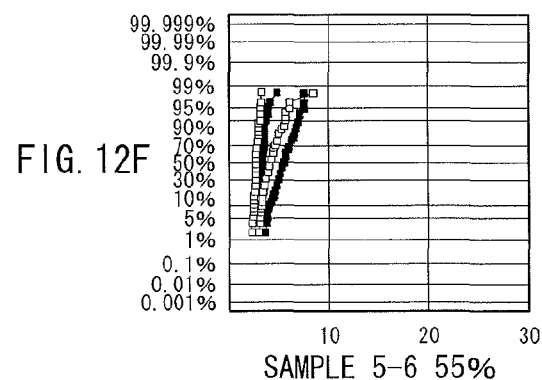
FIG. 12F SAMPLE 5-6 55%
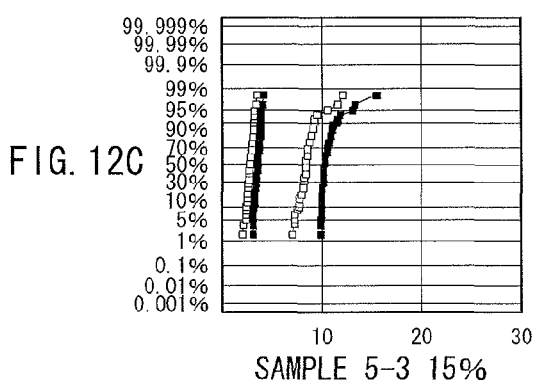
FIG. 12C SAMPLE 5-3 15%
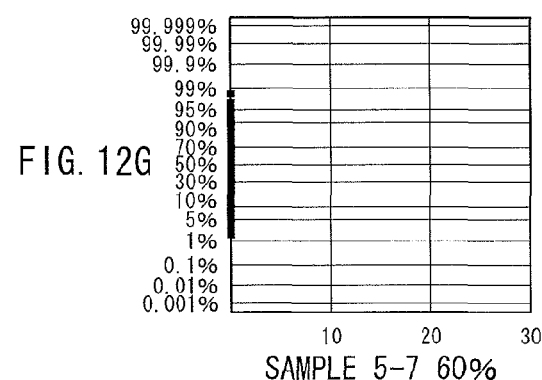
FIG. 12G SAMPLE 5-7 60%
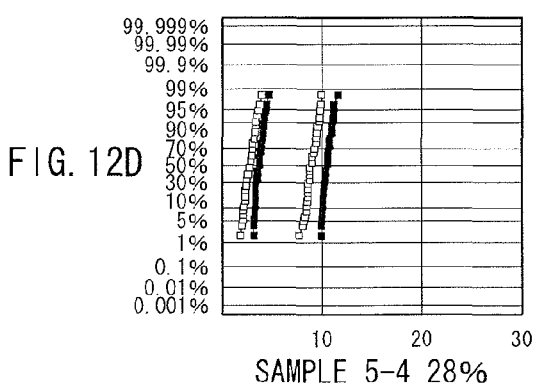
FIG. 12D SAMPLE 5-4 28%

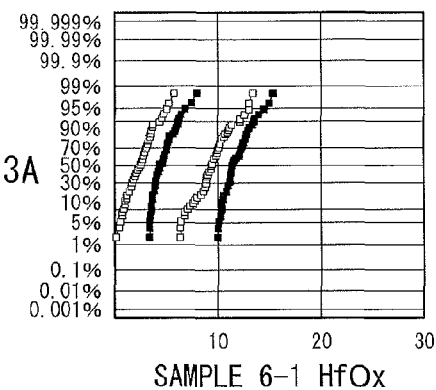
FIG. 13A SAMPLE 6-1 HfOx
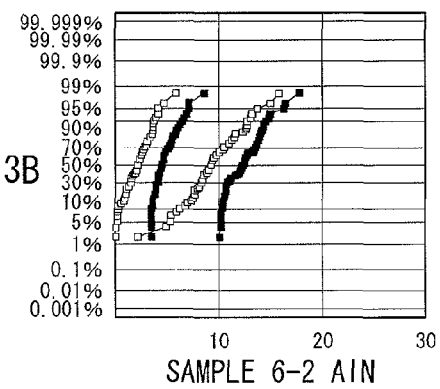
FIG. 13B SAMPLE 6-2 AlN
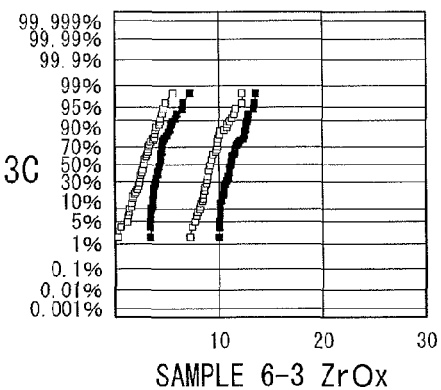
FIG. 13C SAMPLE 6-3 ZrOx
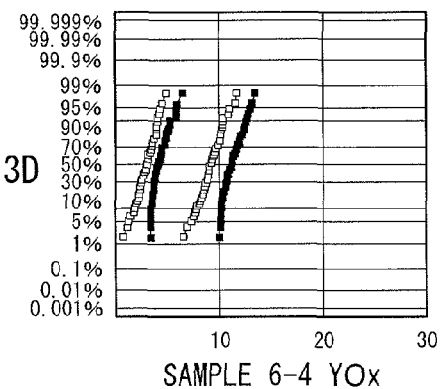
FIG. 13D SAMPLE 6-4 YOx

STORAGE DEVICE AND STORAGE UNIT

BACKGROUND

The present disclosure relates to a storage device and a storage unit, which store information by means of a change in an electrical property of a storage layer including an ion source layer.

In general, NOR or NAND type flash memories are used as semiconductor nonvolatile memories for data storage. These types of semiconductor nonvolatile memories have achieved a large capacity by miniaturizing individual memory devices and drive transistors. However, it is pointed out that their miniaturizations are limited, because a high voltage is necessary to write or erase data, and the number of electrons injected into each floating gate is confined.

Currently, resistance change type memories, such as resistance random access memories (ReRAMs) or phase-change random access memories (PRAMs), are proposed as next generation nonvolatile memories that potentially exceed the limitation of the miniaturization (for example, see Japanese Unexamined Patent Application Publication No. 2006-196537 and Waser, et al., "Advanced Material" Volume 21, page 2932 (2009)). Such memories have a simple structure in which a resistance change layer is formed between two electrodes, and their writing and erasing operations are performed by means of the change in the resistance of the resistance change layer. One reason for the change in the resistance is considered that the atoms or ions travel with heat or an electric field to create a conductive path.

There is another technique for achieving a large capacity of memories which is called a multi-valued technique, in addition to the technique for miniaturizing the memories as described above. Specifically, this technique has achieved multivalued recording by enabling a single device to perform multiple-bit recording. If each device records 2 bit (4 value) or 3 bit (8 value) data, the total capacity is doubled or tripled.

SUMMARY

Memories that are configured to write and erase data by means of a change in the resistance are requested to retain relatively high resistance values with a low current. In order to realize the multivalued recording, for example, it is necessary for a memory to line up medium resistance values (for example, several tens kΩ to several MΩ) between a low resistance value (for example, several tens kΩ or lower) and a high resistance value (for example, several hundreds kΩ to several MΩ), and to retain these resistance values for a long time.

In miniaturized nonvolatile memories, as the device area is decreased, the resistance thereof tends to be increased, as described above. Furthermore, the miniaturization involves the decrease in the drive currents of transistors. Therefore, as each device is miniaturized, the drive current for writing data is deceased, thereby further increasing the resistance value in the low resistance state. For the above reasons, it is difficult to control the medium oxidation states (medium resistance values) necessary for the multi-valued recording, and to retain these middle resistance values.

It is desirable to provide a storage device and a storage unit which make it possible to retain relatively high resistance values recorded with a low current, and to improve a performance of controlling these resistance values.

A storage device according to an embodiment of the present disclosure includes: a first electrode; a storage layer including an ion source layer; and a second electrode. The first electrode, the storage layer, and the second electrode are provided in this order. The ion source layer includes a chalcogen element, oxygen, and one or more transition metal elements selected from the group of Groups 4, 5, and 6 elements of the Periodic Table.

Once a pulse voltage is applied to or a pulse current is supplied to the storage device according to the above-described embodiment of the present disclosure in an initial state (high resistance state) in a "positive direction" (for example, in which the first and second electrodes have negative and positive voltage potentials, respectively), the metal element contained in the ion source layer ionizes and metal ions diffuse in the storage layer (for example, a resistance change layer), or the oxygen ions travel therein. As a result, an oxygen vacancy is created in the resistance change layer. This causes a low resistance portion (conductive path) with a low oxidation state to be formed in the storage layer, so that the resistance of the resistance change layer is decreased (recording state). Meanwhile, once a pulse voltage is applied to the device in the low resistance state in a "negative direction" (for example, in which the first and second electrodes have positive and negative voltage potentials, respectively), the metal ions in the resistance change layer travel to the ion source layer, or the oxygen ions travel from the ion source layer. As a result, the oxygen vacancy is decreased in the conductive path. In response, the conductive path containing the metal element no longer exists, and the resistance change layer shifts to the high resistance state (initial or erasing state).

The ion source layer contains the chalcogen element, the oxygen, and the transition metal element. In particular, one or more metal elements in Groups 4, 5, and 6 elements of the Periodic Table are used for the transition metal element. The transition metal elements in the Groups 4, 5, and 6 of the Periodic Table are more likely to be bonded to oxygen than any other transition metal element is. For this reason, the highly chemically stable conductive path is created, in which the metal ions or oxygen ions are suppressed from traveling when no voltage is applied.

A storage unit according to an embodiment of the present disclosure is provided with a plurality of storage devices and a pulse application section. The pulse application section selectively applies a pulse voltage or supplies pulse currents to the storage devices. Each of the storage devices includes: a first electrode; a storage layer including an ion source layer; and a second electrode. The first electrode, the storage layer, and the second electrode are provided in this order. The ion source layer includes a chalcogen element, oxygen, and one or more transition metal elements selected from the group of Groups 4, 5, and 6 elements of the Periodic Table.

In each of the storage device and the storage unit according to the above-described embodiments of the disclosure, the ion source layer that includes the chalcogen element, the oxygen, and the transition metal element is provided as the storage layer. As for the transition metal element, in particular, one or more metal elements in Groups 4, 5, and 6 elements of the Periodic Table are used. With this configuration, the chemically stable conductive path is formed, in which the metal ions or oxygen ions are suppressed from traveling when no voltage is applied, and therefore the stability of the medium resistance values is improved. Consequently, it is possible to control medium resistance values readily upon wiring data, and to improve the performance of retaining these medium resistance values.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 4A, 4B, and 4C are distribution charts of resistance values and conductance values in Example (Experiment 1) of the embodiment of the present disclosure, before and after a thermal acceleration retention test.

FIGS. 6A to 6F are distribution charts of conductance values in Experiment 2, before and after the thermal acceleration retention test.

FIGS. 10A to 10E are distribution charts of conductance values in Experiment 4, before and after the thermal acceleration retention test.

FIGS. 12A to 12G are distribution charts of conductance values in Experiment 5, before and after the thermal acceleration retention test.

FIGS. 13A to 13D are distribution charts of conductance values in Experiment 6 before and after the thermal acceleration retention test.

DETAILED DESCRIPTION

Hereinafter, an embodiment and the like of the present disclosure will be described in the following order, with reference to the accompanying drawings.
1. Embodiment
  1-1. Storage device
  1-2. Storage unit
2. Examples

Figure 1:
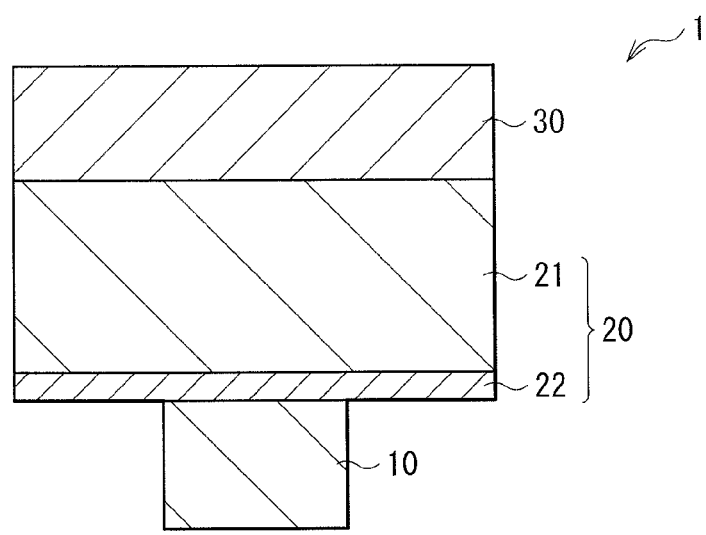
FIG. 1 is a cross-sectional view of a configuration of a storage device according to an embodiment of the present disclosure.

EMBODIMENT (1-1. Storage Device)
FIG. 1 is a cross-sectional view of a configuration of a storage device 1 according to an embodiment of the present disclosure. The storage device 1 includes a lower electrode 10 (first electrode), a storage layer 20, and an upper electrode 30 (second electrode) in this order.

The lower electrode 10 is provided, for example, on a silicon substrate 41 in which a complementary metal oxide semiconductor (CMOS) circuit is formed, as will be described below (see FIG. 2), and serves as a connection to the CMOS circuit. The lower electrode 10 is configured of a wiring material for use in a semiconductor process, such as tungsten (W), tungsten nitride (WN), copper (Cu), aluminum (Al), molybdenum (Mo), tantalum (Ta), silicide, or the like. If the lower electrode 10 is configured of a material, such as Cu, that is likely to cause ion conduction within an electric field, the surface of the lower electrode 10 made of Cu or the like may be coated with a material, such as tungsten (W), tungsten nitride (WN), tantalum nitride (TaN), or the like that is less likely to cause ion conduction or thermal diffusion.

The storage layer 20 has a structure in which an ion source layer 21 and a resistance change layer 22 are laminated on the upper electrode 30 in this order. The ion source layer 21 contains elements that become positive ions to form a conductive path in the resistance change layer 22, and elements that have an ability to negatively ionize. It is to be noted that the metal ions (movable ions), as described above, refer to positive ions in this case.

The ion source layer 21 of this embodiment contains one or more chalcogen elements, including tellurium (Te), sulfur (S), and selenium (Se), as ion conductive materials that negatively ionize, and further contains oxygen (O). In addition, the ion source layer 21 contains one or two or more transition metal elements, as metal elements having an ability to positively ionize, in particular, one or two or more metal elements in Group 4 (titanium (Ti), zirconium (Zr), and hafnium (Hf)), in Group 5 (vanadium (V), niobium (Nb), and tantalum (Ta)), and in Group 6 (chromium (Cr), molybdenum (Mo), and tungsten) of the Periodic Table.

In this embodiment, the ion source layer 21 is provided in contact with the upper electrode 30. In the ion source layer 21, the transition metal elements, the chalcogen elements, and the oxygen, as described above, are bonded to form a metal chalcogenide oxide layer. The metal chalcogenide oxide layer mainly has an amorphous structure, and plays a role of an ion supply source. In the vicinity of the ion source layer 21 or in the resistance change layer 22, the conductive path containing the above transition metal elements is more chemically stable than any other transition metal element, and tends to assume a medium oxidation state and retain this state. For this reason, the performances of controlling resistance values of the storage device 1 and retaining data are improved.

The conductive path formed of the transition metal elements or its surrounding region is able to assume three states composed of a metal state, a chalcogen compound state, and an oxide state which exhibit low, medium, and high resistance values, respectively. The resistance of the resistance change layer 22 is determined depending on how much the three states are mixed, and exhibits various resistance values (medium resistance values) by changing this mixture state. In this embodiment, the transition metal elements which have an ability to form a chemically stable conductive path exhibiting medium resistance values are used for the ion source layer 21, as described above. This improves the performances of controlling the resistance values, in particular, the medium resistance values in the storage device 1, and retaining data.

The resistance change layer 22 contains a metal oxide, a metal nitride, or a metal oxynitride, and is provided in contact with the lower electrode 10 in this embodiment. The resistance change layer 22 varies its resistance when a predetermined voltage is applied between the lower electrode 10 and the upper electrode 30. There is no specific limitation on a metal material for the resistance change layer 22, as long as the resistance change layer 22 is a layer with a high resistance, such as approximately several MΩ to several hundreds GΩ, in an initial state. For example, when a metal oxide is used as a material for the resistance change layer 22, it is desirable that Zr, Hf, Al, a rare earth element, or the like which forms a metal oxide with a high resistance or a high band gap be used as the metal element. When a metal nitride is used, it is desirable that Zr, Hf, Al, a rare earth element, or the like also be used, in terms of an advantage in that the resistance change layer 22 attains a resistance of approximately several MΩ to several hundred GΩ, and the conductive path is likely to oxidize and have a high resistance due to the movement of oxygen during the erase operation. Likewise, when a metal oxynitride is used, there is no limitation on metal elements thereof, as long as they attain approximately several MΩ to several hundred GΩ. The thickness of the resistance change layer 22 may be determined so as to attain the element resistance having approximately several MΩ to several hundred GΩ, as described above. It is preferable that the thickness of the resistance change layer 22 be, for example, approximately 1 nm to 10 nm, however the optimum thickness may be varied depending on the size of the element or the resistance value of the ion source layer 21.

The resistance change layer 22 may not be formed purposely. During a process of manufacturing the storage device 1, the transition metal elements and the oxygen contained in the ion source layer 21 are bonded, so that a metal oxide film corresponding to the resistance change layer 22 is naturally formed on the lower electrode 10. Alternatively, an oxide film which is formed by applying a bias voltage in an erase direction may correspond to the resistance change layer 22.

For the upper electrode 30, an existing semiconductor wiring material may be used, similar to the lower electrode 10. In addition, it is preferable that a material of the upper electrode 30 be stable so as not react with the ion source layer 21 through the post annealing.

When a pulse voltage is applied to or a pulse current is supplied to the storage device 1 of this embodiment from a power source circuit (pulse application section 60) through the lower electrode 10 and the upper electrode 30, the storage layer 20 changes its electrical property (resistance value). With this property, information is written to, erased from, or re-written to the storage device 1. This operation will be concretely described below.

First, a positive voltage is applied to the storage device 1 in an initial state with a high resistance, under the condition that, for example, the upper electrode 30 and the lower electrode 10 have positive and negative voltage potentials, respectively. In response, the transition metal elements in the ion source layer 21 ionize and travel to the side of the lower electrode 10, or the oxygen ions travel from the side of the lower electrode 10, thereby causing a cathode reaction on the side of the lower electrode 10. Then, a reduction reaction occurs in the resistance change layer 22 formed at the interface to the lower electrode 10. As a result of the reduction reaction, parts with a high oxygen vacancy concentration or parts in a low oxidation state are connected to one another, so that a conductive path is formed in the resistance change layer 22. In this case, the resistance change layer 22 exhibits a lower resistance value (low resistance state) than that in the initial state (high resistance state).

After the conductive path is formed, even when applying the voltage to the storage device 1 is stopped by removing the positive voltage, the low resistance state is retained. Through the above processing, information has been written to the storage device 1. If the storage device 1 is applied to a storage unit that enables only one-time writing, namely, a programmable read only memory (PROM), the recording operation is completed only by the above recording process.

Meanwhile, the storage device 1 is applied to a storage unit that enables erasing, namely, a random access memory (RAM), an electronically erasable and programmable read only memory (EEPROM), or the like, an erasing process is necessary. During the erasing process, a negative voltage is applied to the storage device 1 under the condition that, for example, the upper electrode 30 and the lower electrode 10 have negative and positive voltage potentials, respectively. In response, because of an anode reaction occurring in the conductive path having been formed in the resistance change layer 22, the transition metal ions oxidize in the parts with a high oxygen vacancy concentration or the parts in a low oxidation state which constitute the conductive path, thereby traveling to the side of the ion source layer 21. Alternatively, the oxygen ions travel from the ion source layer 21 to the region surrounding the conductive path in the resistance change layer 22, thereby decreasing the oxygen vacancy concentration or enhancing the oxidation state in the conductive path. Consequently, the conductive path is cut off, and the resistance value which the resistance change layer 22 exhibits is changed from the low resistance state to the high resistance state.

After the conductive path is cut off, even when applying the voltage to the storage device 1 is stopped by removing the negative voltage, the high resistance value is retained. Through the above processing, information has been erased from the storage device 1. By repeating above processes, information is repeatedly written to and erased from the storage device 1.

In the storage device 1 as described above, for example, it is assumed that the states with the high resistance value and with the low resistance value correspond to information "0" and "1", respectively. In this case, during the information recording process performed by applying a positive voltage, the information "0" is changed into "1." Likewise, the information erasing process performed by applying a negative voltage, the information "1" is changed into "0." In this assumption, the operation of decreasing the resistance of the storage device 1 corresponds to the writing operation, and the operation of increasing the resistance of the storage device 1 corresponds to the erasing operation. However, this correspondence relationship may be defined inversely.

In this embodiment, when the bias voltage is applied to the lower electrode 10 during the writing operation, the so-called writing resistance is controlled by controlling the bias voltage, a limit resistance, or a voltage applied to a gate of a drive MOS transistor, thereby adjusting the medium resistance value. Likewise, during the erasing operation, the bias voltage, the limit resistance, or a current supplied by the voltage applied to the gate of the MOS transistor is adjusted, thereby controlling the medium resistance value. In this way, it is possible to provide not only a binary memory but also a multivalued memory.

For example, by adjusting the medium resistance value between the two resistance values corresponding to "0" and "1", two levels are newly added. In this case, it is achieved that four values of "00", "01", "10", and "11", or 2 bits of information, are recorded to each device.

To be specific, in the storage device 1 of this embodiment, the above transition metal elements that are relatively stable in a layer containing a chalcogen element and oxygen are used in the ion source layer 21, as described above. As a result, this configuration improves the performances of controlling and retaining the medium resistance values. Moreover, when an amount of oxygen and a composition ratio of the transition metal elements to the chalcogen elements in the ion source layer 21 are prepared, the performances of controlling and retaining the resistance values are further improved. Hereinafter, a description will be given of a preferable amount of oxygen and a preferable composition ratio of the transition metal elements to the chalcogen elements which are contained in the ion source layer 21.

As described above, the resistance value which the resistance change layer 22 exhibits is controlled depending on the states of the transition metal elements within the region surrounding the conductive path, namely, the three states of "metal/tellurium compound/oxide." The three states are changed depending on the amount of oxygen contained in the ion source layer 21, and it is achieved that the three states are controlled appropriately by adjusting the amount of oxygen so as to fall within a range of 10% to 55% both inclusive. If the amount of oxygen is more than 55% in the ion source layer 21, the contribution of the bonding of the transition metal elements to the oxygen becomes too strong. In this case, it is difficult to assume the three states of "metal/tellurium compound/oxide", thereby deteriorating the performance of retaining the medium resistance. Meanwhile, if the amount of oxygen is less than 10% in the ion source layer 21, the medium compositions and the bonding state are difficult to retain, thus making it difficult to retain the medium resistance values. The exact reason for this is not evident, but it is believed that because the contribution of bonding of the transition metal elements to the oxygen becomes weak, the bonding state of the oxygen, the tellurium, and the transition metal elements is likely to be imbalanced.

The above phenomenon applies to chalcogen elements other than tellurium, namely, sulfur and selenium having different electronegativity from oxygen. A combination of two or more of sulfur, selenium, and tellurium may be used as the chalcogen elements contained in the ion source layer 21. It is to be noted that in this embodiment, the amount of oxygen, as described above, is determined by measuring the ion source layer 21 of the storage device 1 with the Rutherford back scattering (RBS).

The three states of "metal/tellurium compound/oxide" are also controlled by the composition ratio of the transition metal elements to the chalcogen elements which are contained in the ion source layer 21, in addition to the amount of oxygen therein. The compound ratio of the transition metal elements to the chalcogen elements which enables the three states to be controlled appropriately falls within a range of 3:7 to 7:3 both inclusive. If the ratio of the transition metal elements to the chalcogen elements is too low, the resistance of the ion source layer 21 becomes too high. In this case, it is difficult to perform the device operation even with a voltage generated by the MOS circuit. This tendency is prominent, in particular, in a fine device produced through an advanced process. Meanwhile, if the ratio of the transition metal elements to the chalcogen elements is too high, the bonding state of the oxygen, the tellurium, and the transition metal elements tends to be imbalanced. Therefore, the phase or chemical change is likely to occur, thus making it difficult to retain the medium resistance.

Hereinafter, a description will be given of a method of manufacturing the storage device 1 of this embodiment.

First, the lower electrode 10 made of, for example, TiN is formed on a substrate in which a CMOS circuit including selection transistors is formed. In this case, an oxide and the like are removed from the surface of the lower electrode 10 by means of, for example, reverse sputtering, as necessary. Then, targets are prepared, which have compositions corresponding to the respective materials of the resistance change layer 22, the ion source layer 21, and the upper electrode 30, and the individual layers are sequentially formed by changing the targets in a sputtering apparatus. In this case, the diameter of the electrode is approximately 50 nm to 300 nm, and alloy films are formed by using the targets of constituent elements of these alloy films at the same time.

After the upper electrode 30 has been formed, a wiring layer (not illustrated) to be connected to the upper electrode 30 is formed, and a contact portion of the wiring layer is connected to the storage device 1 in order to obtain a common voltage potential among other the storage devices 1. Then, the laminated layers are subjected to a post annealing treatment. Through the above processing, the storage device 1, as illustrated in FIG. 1, has been produced.

In the storage device 1, as described above, the conductive path is formed in the resistance change layer 22 by applying a voltage to both the upper electrode 30 and the lower electrode 10 such that one of the upper electrode 30 and the lower electrode 10 has a positive voltage potential and the other thereof has a negative voltage potential. Because of the conductive path, the resistance of the resistance change layer 22 is decreased, so that a writing operation is performed. Meanwhile, when a voltage whose polarities are opposite to that upon writing operation is applied to the upper electrode 30 and the lower electrode 10, the metal elements of the conductive path formed in the resistance change layer 22 ionize, thereby traveling to the ion source layer 21. Alternatively, oxygen ions travel from the ion source layer 21 to the resistance change layer 22, in particular, to the region of the conductive path. In response, the oxygen vacancy concentration is decreased or the oxidation state is enhanced, thereby cutting off the conductive path. As a result, the resistance of the resistance change layer 22 is increased, so that the erasing operation is performed. Furthermore, by preparing the applied voltages upon writing and erasing operations, the medium resistance values are controlled, thereby achieving multivalued recording.

As an example of currently-available storage devices which employ miniaturization technique, a storage device is reported which has a configuration of "lower electrode/storage layer/upper electrode", and which is made of a RRAM (Registered Trademark) material containing, for example, oxygen and transition metal elements. In this type of miniaturized storage devices, a drive current of a transistor decreases, and therefore the drive current for a writing operation decreases. Thus, the resistance in the low resistance state is further increased. As a result, a range of the respective resistance values in the high and low resistance states (resistance range) is narrowed. In order to achieve the multivalued recording, as described above, it is necessary for a memory that performs writing and erasing operation by means of a change in the resistance to control medium resistance values between low and high resistance values and to retain these values over a long period. Specifically, in order to perform a multivalued operation, it is necessary to separate the narrow resistance range into, for example, 4 levels (2 bits/cell) or 8 levels (3 bits/cell) and to retain these resistance values.

In the storage device as described above, however, an element bonded to the metal elements is limited to oxygen. Therefore, even when a conductive path is formed by the application of the voltage, the thermal and chemical properties of this conductive path are not sufficiently stable. Accordingly, the conductive path may oxidize again and its resistance may be increased due to long time storage or a thermal acceleration. This makes it difficult to retain medium resistance values between high and low resistance values which are necessary to achieve the multivalued recording, in particular, line up the medium resistance values as multiple bits, and to retain these medium resistance values over a long period.

Meanwhile, in a storage device that contains transition metal elements and chalcogen elements such as tellurium, copper (Cu) is used in addition to the transition metal elements. The copper (Cu) is contained in the conductive path of such a storage device. Copper (Cu) tends to cause ion conduction in the matrix of the chalcogen elements. Therefore, the thermal and chemical properties of copper (Cu) in the chalcogen elements are not sufficiently stable, thus making it difficult to control medium resistance values and retain these values over a long period, similar to currently-available storage devices as described above.

In contrast, in the storage device 1 of this embodiment, the chalcogen elements, the oxygen, and the transition metal element are used as materials for the ion source layer 21, and in particular, one or more metal elements in Groups 4, 5, and 6 elements of the Periodic Table are used as the transition metal element. The respective metal elements in Groups 4, 5, and 6 of the Periodic Table are more likely to be bonded to oxygen than any other transition metal element is, thereby forming chemically stable conductive path. Specifically, once being bonded to or trapping an oxygen atom, each of those metal elements does not tend to release it. Consequently, it is possible to from the conductive path from which the constituent metal ions are less likely to travel when no voltage is applied.

In the storage device 1 of this embodiment, as described above, the ion source layer 21 is formed with the chalcogen elements, the oxygen, and the transition metal element, and in particular, one or more metal elements selected from the group of Groups 4, 5, and 6 elements of the Periodic Table are used as the transition metal element. With this configuration, the chemically stable conductive path is formed when no voltage is applied, thereby making it possible to control the medium oxidation state (medium resistance values) readily, and to improve the performance of retaining these medium resistance values.

(1-2. Storage Unit)

A storage unit (memory) is constituted by arraying the many storage devices 1, for example, in a row or in a matrix fashion. In this case, a MOS transistor or diode for an element selection may be connected to each storage device 1, thereby constituting memory cells, as necessary. Moreover, each memory cell may be connected to, for example, a sense amplifier, an address recorder, and a writing/erasing/reading circuit through a wire.

Figure 2:
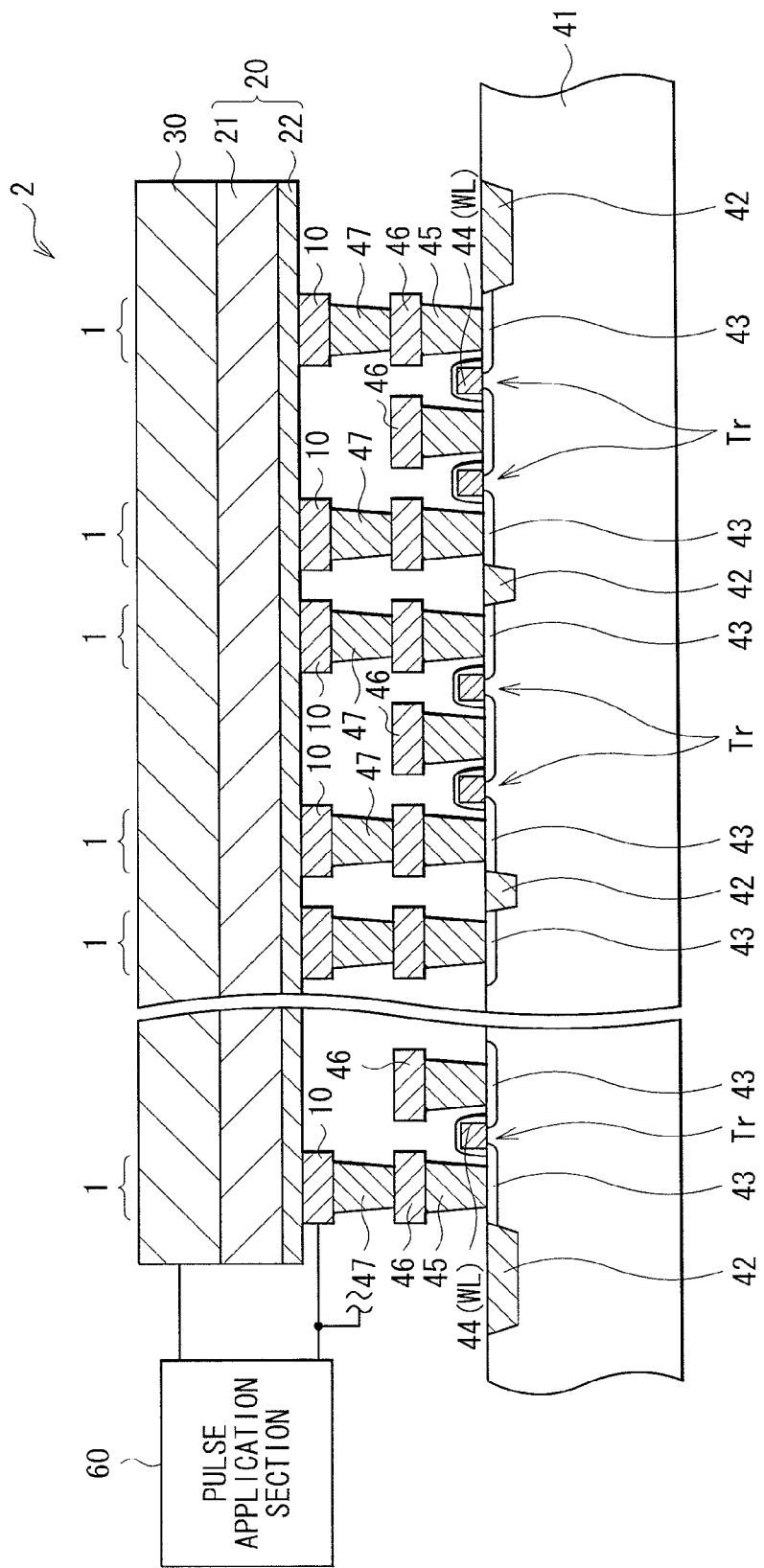
FIG. 2 is a cross-sectional view of a configuration of a memory array including the storage devices of FIG. 1.
Figure 3:
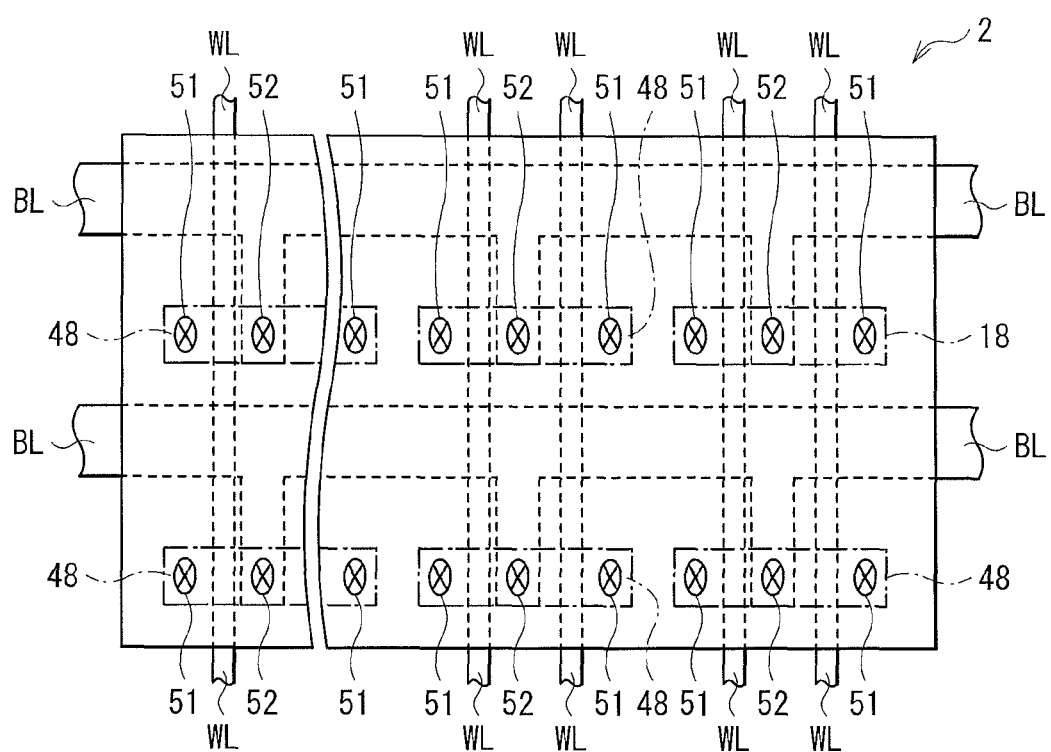
FIG. 3 is a plan view of the memory array.

FIGS. 2 and 3 illustrate an example of the storage unit (memory cell array) in which the many storage devices 1 are arranged in a matrix fashion. In more detail, FIG. 2 illustrates a cross-sectional configuration of the storage unit, and FIG. 3 illustrates a planar configuration thereof. For each storage device 1 in this memory array, a wire connected to its lower electrode 10 and a wire connected to its upper electrode 30 are provided so as to intersect each other. For example, each storage device 1 is disposed near the intersection of these wires.

The individual storage devices 1 share the resistance change layer 22, the ion source layer 21, and the upper electrode 30. In other words, each of the resistance change layer 22, the ion source layer 21, and the upper electrode 30 is constituted by a single layer (the same layer) that is common to the individual storage devices 1. The upper electrode 30 serves as a plate electrode PL that is common to the cells arranged adjacent to one another.

The lower electrode 10 is provided for each memory cell, and adjacent ones of the lower electrodes 10 are electrically isolated from one another. Each storage device 1, which serves as a memory cell, is defined by a location corresponding to each lower electrode 10. The lower electrodes 10 are connected to corresponding MOS transistors Tr for a cell selection, and the respective storage devices 1 are provided above these MOS transistors Tr.

Each MOS transistor Tr includes source-drain regions 43 and a gate electrode 44 that are formed within a region of the substrate 41 which is separated by an element separation layer 42. A side-wall insulating layer is formed on a wall surface of each gate electrode 44. Each gate electrode 44 also serves as a word line WL that is one of address wires of each storage device 1. One of the source-drain regions 43 in each MOS transistor Tr is electrically connected to the lower electrode 10 of each storage device 1 through a plug layer 45, a metal wire layer 46, and a plug layer 47. The other of the source-drain regions 43 in each MOS transistor Tr is connected to the metal wire layer 46 through the plug layer 45. Each metal wire layer 46 is connected to a bit line BL (see FIG. 3) which is the other address wire of each storage device 1. In FIG. 3, an active region 48 of each MOS transistor Tr is depicted by a chain line. Furthermore, contact portions 51 are connected to the lower electrodes 10 of the storage devices 1, and contact portions 52 are connected to the bit lines BL.

In the memory array as described above, when the gate of the MOS transistor Tr is turned ON by the word line WL and a voltage is applied to the bit line BL, a voltage is applied to the lower electrode 10 of the selected memory cell through the source-drain of the MOS transistor Tr. Here, when a polarity of the voltage applied to the lower electrode 10 is negative relative to a voltage potential at the upper electrode 30 (plate electrode PL), the resistance of the storage device 1 transits to the low resistance state, as described above. In this way, information is written to the selected memory cell. Meanwhile, when a voltage of a positive potential relative to the voltage potential at the upper electrode 30 (plate electrode PL) is applied to the lower electrode 10, the resistance of the storage device 1 transits to the high resistance state again. In this way, the written information is erased from the selected memory cell. When the written information is read from the memory cell, for example, the MOS transistor Tr selects this memory cell, and a predetermined voltage or current is applied or supplied to the selected memory cell. In this case, the current or voltage, which is changed depending on the resistance state of the storage device 1, is detected through the sense amplifier or the like connected to an end of the bit line BL or the plate electrode PL. The voltage or current applied to or supplied to the selected memory cell is set lower or smaller than a threshold of the voltage or the like at which the resistance of the storage device 1 transits.

As described above, the storage unit 2 of this embodiment is applicable to various types of memory devices. For example, the storage unit 2 is applicable to any memory configuration, including: PROMs that enable only a one-time wiring operation, EEPROMs that enable an electrical erasing operation, and so-called RAM that enables high-speed writing, erasing, and reproducing operations.

EXAMPLES

Hereinafter, specific Examples of one embodiment of the present disclosure will be described.

Experiment 1

Resistance Retention Properties of Storage Devices Made of Materials of Embodiment and of Existing Cases Samples 1-1 to 1-3 were fabricated by using the above manufacture method of the storage device 1. First, the lower electrode 10, made of TiN, which had been formed by embedding a transistor in a substrate was cleaned with reverse sputtering; an Al film was formed to a thickness of approximately 2 nm; and the Al film was oxidized with oxygen plasma to form an AlOx film as the resistance change layer 22. Next, Zr 50% and Te 50% (atomic percent ratio) were subjected to reactive sputtering with an argon process gas in which argon (Ar) and oxygen were mixed such that a flow amount ratio of Ar (sccm) to oxygen (sccm) was 75:5. As a result, a ZrTeOx layer of approximately 45 nm thick was formed as the ion source layer 21. Subsequently, a W film of approximately 30 nm thick was formed as the upper electrode 30. Finally, this resultant was subjected to a thermal treatment at 320° C. for two hours, and then was patterned, so that the storage device (sample 1-1) was fabricated. Moreover, the samples 1-2 and 1-3 were fabricated through similar processing. The compositions of the individual samples are shown as follows in the order of "lower electrode/resistance change layer/ion source layer/upper electrode."

(Sample 1-1) TiN/Al (2 nm)-Ox/Zr50Te50-Ox (45 nm)/W (30 nm)
(Sample 1-2) TiN/Al (2 nm)-Ox/Zr50Te50 (45 nm)/W (30 nm)
(Sample 1-3) TiN/ZrOx (5 nm)/W (30 nm)

Respective memory arrays were fabricated by using the above samples. In each sample, the device conductances 3 µS and 10 µS ware set as binary levels 1 and 2, respectively. Furthermore, each sample performed a writing operation of 60 bit data. In more detail, the writing voltage was set to 3.5 V, and the gate voltage is increased from 0.8 V in 0.05 V steps. While the gate voltage was being increased, the writing pulse voltage was applied to each sample, until the conductance of each sample becomes a preset conductance value. When its conductance reached the preset conductance value, each sample stopped the writing operation. In this way, the individual conductance values were lined up. In the case where the sample did not exhibit the preset conductance value even when the writing pulse voltages were applied 40 times or more, this sample was made to terminate the writing operation at this time. Next, each sample was subjected to a thermal acceleration retention test at 150° C. for one hour. Then, variations in resistance values (left parts of FIGS. 4A, 4B, and 4C) and conductance values (right parts of FIGS. 4A, 4B, and 4C) of each sample were measured.

Each of the binary levels 1 (3 µS) and 2 (10 µS) corresponds to a medium resistance value between that in the high and low resistance states. In the case of using an ion source layer configured of a material used in existing cases, it is difficult to line up the conductance values and to retain these values. In the distribution charts of the inductance values which are shown in the left parts of FIGS. 4A to 4C, the lateral axis represents a cumulative frequency distribution that is standardized by the standard deviation σ of a normal distribution, and each data label is indicated by a probability %. In addition, the lateral axis represents a conductance value (µS). Each filled circle indicates a read-out value after data set, and each open circle indicates a distribution of the conductance values after the thermal acceleration retention test.

As described above, it is possible to increase the capacity of a memory by miniaturizing the storage devices and the transistors. However, the drive currents of the miniaturized transistors are decreased, which involves the decrease in the recording current. Therefore, the memory is requested to operate at a resistance of 100 kΩ or more or at a conductance of 10 µS or lower (corresponding to the levels 1 and 2). The sample 1-1 (FIG. 4A) exhibits a very small shifted amount of the resistance values before and after the thermal acceleration retention test. Meanwhile, as for the conductance values of the sample 1-1, its initial conductance value is 0.002 µS, and the two distribution curves are created in the vicinity of 3 µS and 10 µS, respectively. This result demonstrates that the sample 1-1 normally performed writing operations at the levels 1 and 2. Moreover, the conductance values at each of levels 1 and 2 are nearly equalized, and each of the distribution curve indicates a small shifted amount of the conductance values in the thermal acceleration retention test. For the above reasons, it is considered that the sample 1-1 is equipped with the properties of controlling and retaining medium resistance values appropriately. Next, the sample 1-2 in which the ion source layer 21 is composed of only the transition metal element and the chalcogen element, and the sample 1-3 in which no ion source layer is formed and a layer made of only zirconium oxide is formed as the storage layer 20 are compared with the sample 1-1. Both of the samples 1-2 and 1-3 fail to retain the resistance values of 100 kΩ or more appropriately; fail to exhibit the writing distribution of the conductance values at the levels 1 and 2 appropriately either; and indicate a large shifted amount of the conductance values before and after the thermal acceleration retention test.

Figure 5:
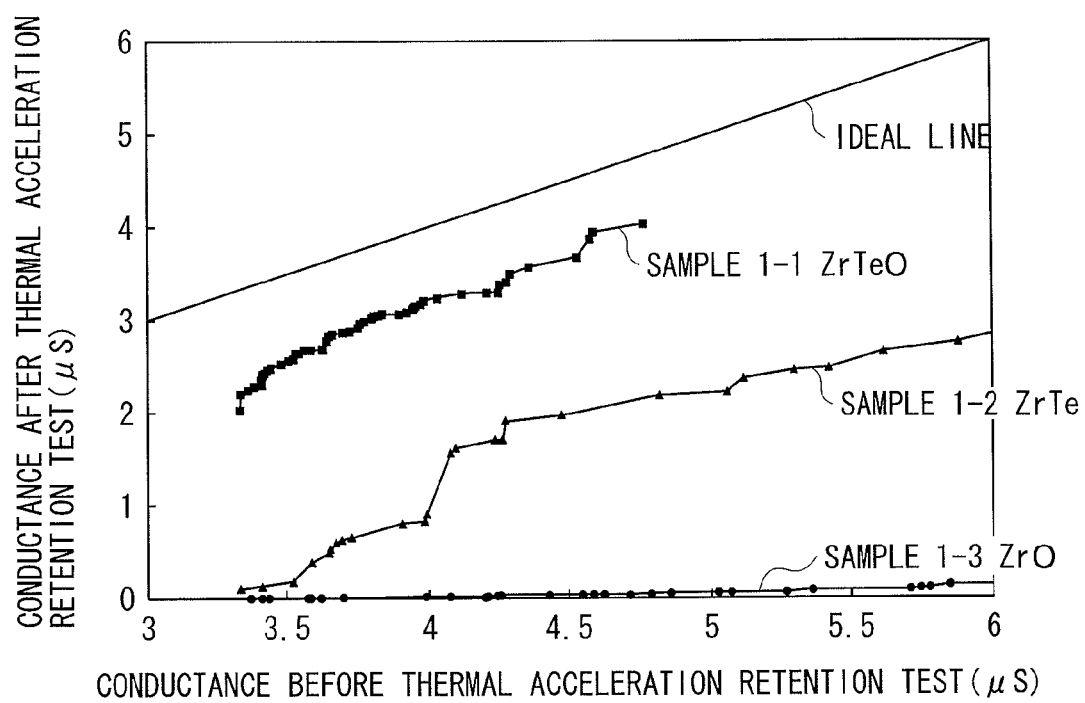
FIG. 5 is a characteristic diagram depicting a variation in conductance values for each material system, before and after the thermal acceleration retention test.

A conductance value at the level 1 (3 µS) is the most difficult to retain, and therefore clearly reveals the performance of a storage device. FIG. 5 is a property diagram depicting, by using the data for the level 1, how much the distribution curve created by the respective conductances of each of the samples 1-1 to 1-3 before and after the thermal acceleration retention test deviates from an ideal line (indicating an ideal state where conductance is not varied at all before and after the thermal acceleration retention test). In the diagram of FIG. 5, the lateral axis represents a conductance value in a conductance distribution before the thermal acceleration retention test, and the vertical axis represents the plot of individual values in the conductance distribution after the thermal acceleration retention test. FIG. 5 reveals that the sample 1-1 according to one embodiment of the present disclosure in which the transition metal element, the tellurium (Te), and the oxygen were used for the ion source layer 21 improves the property of retaining the conductance values within the low conductance range, in comparison with storage devices (samples 1-2 and 1-3) made of materials used in existing cases. In other words, it can be understood therefrom that the properties of controlling and retaining the medium resistance values, which has been requested to multivalued memories, are improved by using a transition metal element, tellurium (Te), and oxygen as materials for the ion source layer 22.

Data was written to each of the samples 2-1 and 2-19 fabricated under the above conditions, in such a way that conductance values thereof were varied between the level 1 (3 μS) and the level 2 (10 μS) for every 60 bits. Then, a variation in the conductance values in each sample was measured before and after the thermal acceleration retention test. FIGS. 6A to 6F depict distributions of conductance values of the samples 2-3, 2-12, 2-15, 2-17, 2-18, and 2-19, respectively, before and after the thermal acceleration retention test. Furthermore, film peeling tests were conducted, after the storage layer 20 was formed and an annealing process was performed at 320° C. Subsequently, the floating and peeling of the film were confirmed upon device microprocessing, and these results are shown in a table 1.

TABLE 1

| | MATERIAL | AFTER FORMATION OF STORAGE LAYER | AFTER ANNEALING AT 320° C. | MICROPROCESSING |
|---|---|---|---|---|
| SAMPLE 2-1 | Ti40—Te60—Ox | GOOD | GOOD | GOOD |
| SAMPLE 2-2 | Zr40—Te60—Ox | GOOD | GOOD | GOOD |
| SAMPLE 2-3 | Hf50—Te50—Ox | GOOD | GOOD | GOOD |
| SAMPLE 2-4 | V50—Te50—Ox | GOOD | GOOD | GOOD |
| SAMPLE 2-5 | Nb40—Te60—Ox | GOOD | GOOD | GOOD |
| SAMPLE 2-6 | Ta40—Te60—Ox | GOOD | GOOD | GOOD |
| SAMPLE 2-7 | Cr40—Te60—Ox | GOOD | GOOD | GOOD |
| SAMPLE 2-8 | Mo40—Te60—Ox | GOOD | GOOD | GOOD |
| SAMPLE 2-9 | W40—Te60—Ox | GOOD | GOOD | GOOD |
| SAMPLE 2-10 | Mn55—Te45—Ox | GOOD | GOOD | GOOD |
| SAMPLE 2-11 | Co40—Te60—Ox | GOOD | POOR | POOR |
| SAMPLE 2-12 | Ni40—Te60—Ox | GOOD | GOOD | GOOD |
| SAMPLE 2-13 | Pd55—Te45—Ox | GOOD | AVERAGE | AVERAGE |
| SAMPLE 2-14 | Cu40—Te60—Ox | GOOD | | POOR |
| SAMPLE 2-15 | Ag60—Te40—Ox | AVERAGE | AVERAGE | POOR |
| SAMPLE 2-16 | Zn40—Te60—Ox | GOOD | GOOD | POOR |
| SAMPLE 2-17 | Cu—Zr—Te—Al | GOOD | GOOD | GOOD |
| SAMPLE 2-18 | Zr—Al—Te—Ox | GOOD | GOOD | GOOD |
| SAMPLE 2-19 | Cu—Zr—Te—Ox | GOOD | GOOD | GOOD |

Experiment 2

Properties of Storage Devices in which Various Transition Metal Elements are Used Samples 2-1 to 2-19 were fabricated through processing similar to that for the above storage devices (samples 1). Among these samples, the same lower electrode, resistance change layer, and upper electrode, which were made of TiN, Al (2 nm)-Ox, and W (30 nm), respectively, were used. The compositions of the ion source layers in the individual samples are listed as follows.
(Sample 2-1) Ti40 Te60-Ox (45 nm)
(Sample 2-2) Zr40 Te60-Ox (45 nm)
(Sample 2-3) Hf40 Te60-Ox (45 nm)
(Sample 2-4) V50 Te50-Ox (45 nm)
(Sample 2-5) Nb40 Te60-Ox (45 nm)
(Sample 2-6) Ta40 Te60-Ox (45 nm)
(Sample 2-7) Cr40 Te60-Ox (45 nm)
(Sample 2-8) Mo40 Te60-Ox (45 nm)
(Sample 2-9) W40 Te60-Ox (45 nm)
(Sample 2-10) Co40 Te60-Ox (45 nm)
(Sample 2-11) Mn55 Te45-Ox (45 nm)
(Sample 2-12) Ni40 Te60-Ox (45 nm)
(Sample 2-13) Pd40 Te60-Ox (45 nm)
(Sample 2-14) Cu40 Te60-Ox (45 nm)
(Sample 2-15) Ag50 Te50-Ox (45 nm)
(Sample 2-16) Zn50 Te50-Ox (45 nm)
(Sample 2-17) CuZrTeAl (45 nm)
(Sample 2-18) AlZrTeO (45 nm)
(Sample 2-19) CuZrTeO (45 nm)

In the sample 2-3 (FIG. 6A) according to the above-described embodiment, Hf in Group 4 of the Periodic Table was used as a transition metal element in the ion source layer 21. The sample 2-3 retains the conductance values at both the levels 1 and 2 more appropriately than the above samples 1-2 and 1-3 do, for which materials of existing cases were used. In contrast, for example, the sample 2-12 (FIG. 6B) in which Ni in Group 10 of the Periodic Table was used as a transition metal element exhibits a degraded conductance distribution after data is written. Specifically, most of the conductance values at the levels 1 and 2 are decreased to approximately 0 after the thermal acceleration retention test. Thus, the resistance values are not retained appropriately. Although not shown in the figures, the above tendency also applies to both samples 2-11 and 2-13 in which manganese (Mn) (in Group 7) and palladium (Pd) (in Group 10) were used, respectively. As shown in FIG. 6C, in fact, data failed to be written to the sample 2-15 for which silver (Ag) (in Group 11) was used. This failure also occurred in cobalt (Co) (in Group 9) (sample 2-10), copper (Cu) (in Group 11) (sample 2-14), and zinc (Zn) (in Group 12) (sample 2-16). Each of the samples 2-17 (+CuAl), 2-18 (+Al), and 2-19 (+Cu) had the ion source layer that contained a transition metal element in Group other than Groups 4, 5, and 6 as an addition element, in addition to a transition metal element in Groups 4, 5, and 6. As shown in FIGS. 6D to 6F, neither of the samples 2-17, 2-18, and 2-19 exhibits a sufficient retention property, because most or all of the conductance values at the levels 1 and 2 are decreased to approximately 0 after the thermal acceleration retention test, similar to the sample 2-12. Although not shown in the figures, the samples 2-1, 2-2, and 2-4 to 2-9, each of which had the ion source layer containing a transition metal element in Groups 4, 5, or 6 of the Periodic Table, similar to the sample 2-3, had appropriate properties of controlling and retaining the conductance values at both the levels 1 and 2.

In the ion source layers (of the samples 2-10 and 2-13 to 2-16), each of which contained a transition metal element in Groups other than Groups 4 to 6, in particular, which contained Ni, Pd, Ag, Cu, Zn, respectively, the floating or peeling of the film occurred after the annealing at 320° C. or upon device microprocessing. Thus, the samples 2-10 and 2-13 to 2-16 had difficulty forming their element structures appropriately. As for Mn (sample 2-11) and Ni (sample 2-12) with this composition ratio of Experiment, the floating or peeling of the film was not observed after the formation of the storage layer 20 and upon device microprocessing. However, any of Mn (sample 2-11) and Ni (sample 2-12) may cause the floating or peeling of the film with a certain composition ratio. Therefore, it can be understood therefrom that the use of a transition metal element selected from those in Groups 4 to 6 of the Periodic Table is preferable for the ion source layer 22 according to embodiments of the technology.

Figure 7A:
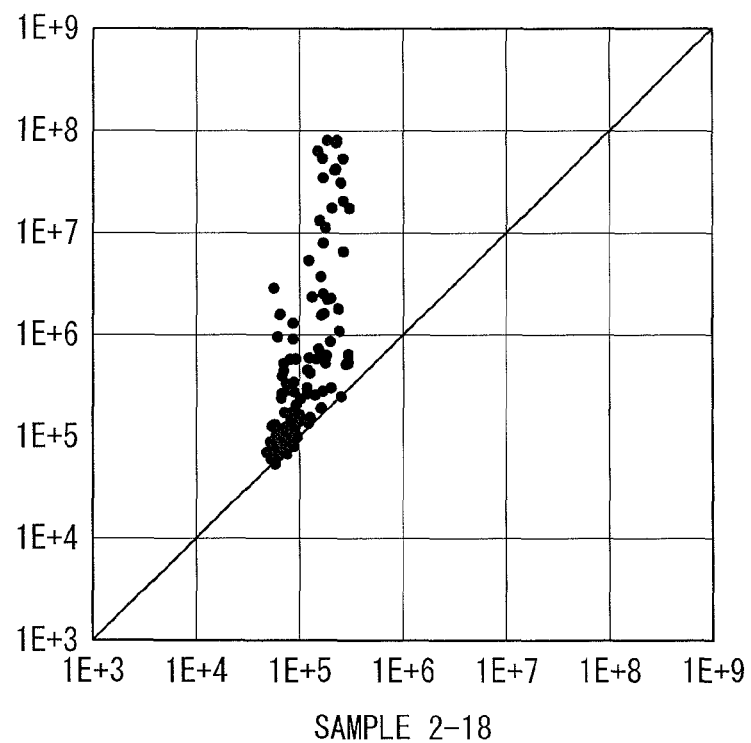
FIGS. 7A and 7B are distribution charts of resistance values in Experiment 2.
Figure 7B:
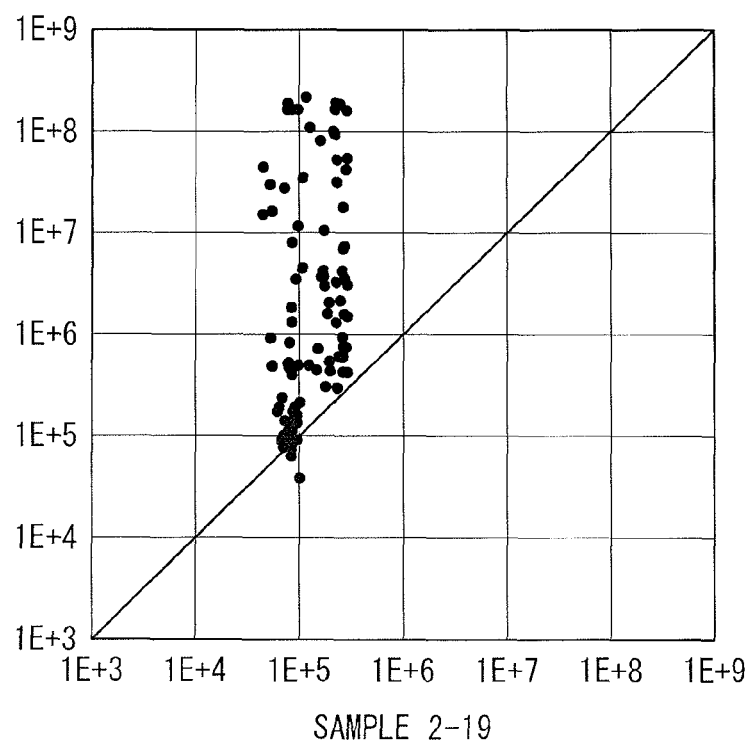

FIGS. 7A and 7B depict variations in resistance values of the samples 2-18 and 2-19, respectively, before and after the thermal acceleration retention test. It can be understood therefrom that, when a transition metal element other than those in Groups 4 to 6 of the Periodic Table is used as an addition element for the ion source layer, the performance of retaining resistance values of 100 kΩ or more is degraded, similar to the above samples 1-2 and 1-3.

Figure 8:
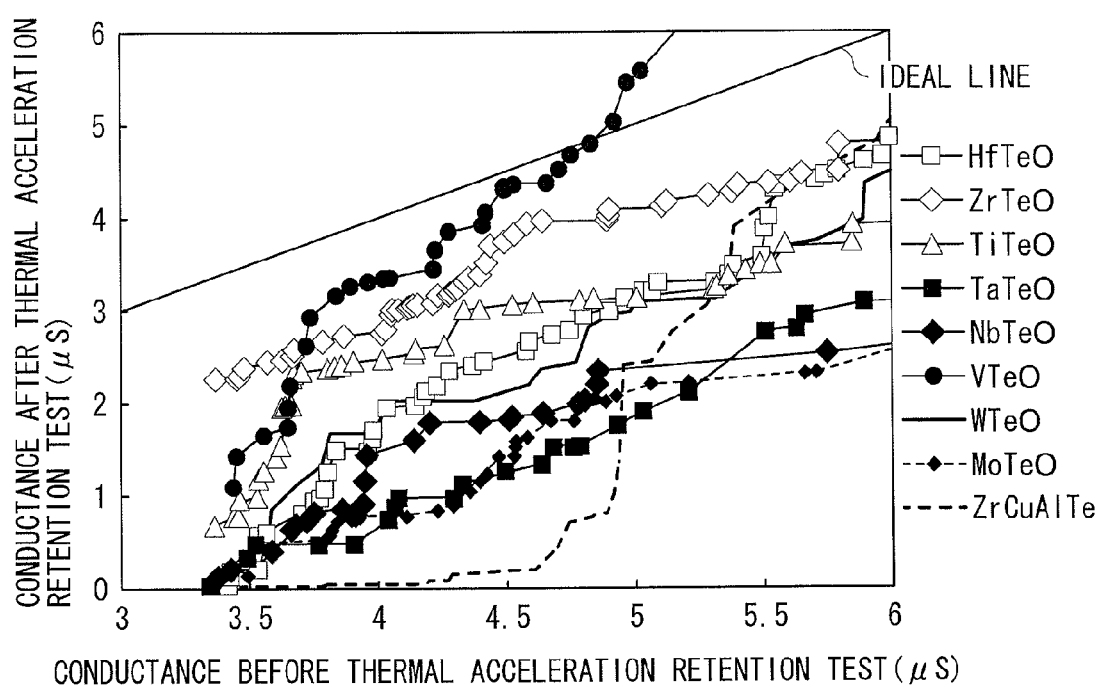
FIG. 8 is a characteristic diagram depicting a variation in conductance values for each material system, before and after the thermal acceleration retention test.
Figure 9A:
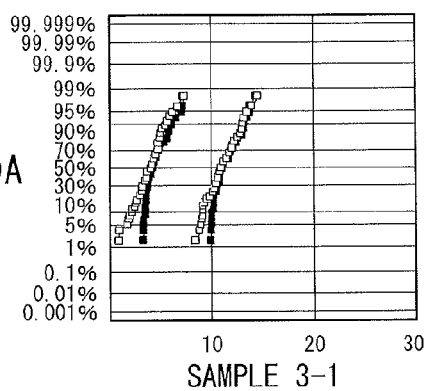
FIGS. 9A to 9D are distribution charts of conductance values in Experiment 3, before and after the thermal acceleration retention test.
Figure 9B:
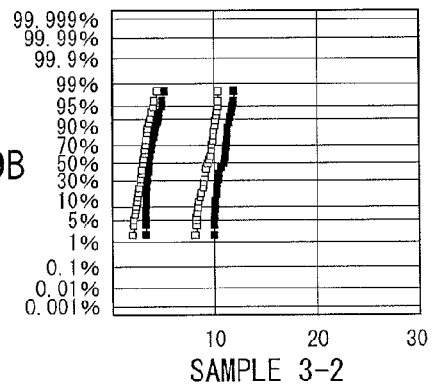
Figure 9C:
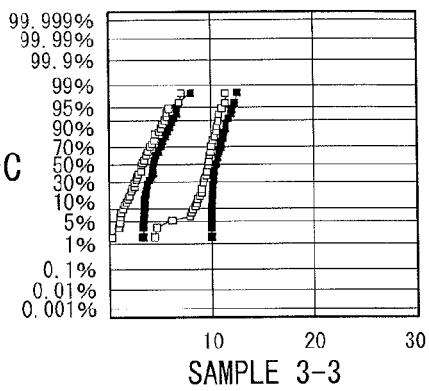
Figure 9D:
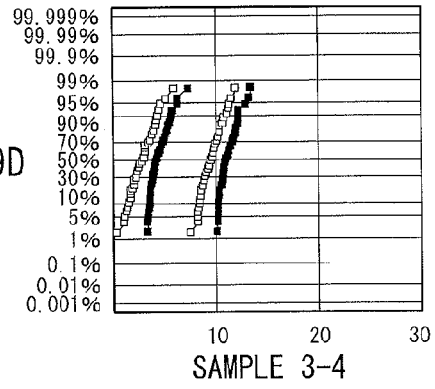

FIG. 8 is a characteristics diagram depicting a distribution of conductance values of each of the samples 2-1 to 2-9 and 2-17 at the level 1 before and after the thermal acceleration retention test, similar to FIG. 5. Here, the samples 2-1 to 2-9 each had the ion source layer that had contained a transition metal element in Group 4, 5, or 6, and the sample 2-17 had the ion source layer that had further contained Cu and Al, in addition to the above element. The distribution curve of each of the samples 2-1 to 2-9 did not greatly deviate from an ideal line in the vicinity of 3.5 µS to 5 µS after the thermal acceleration retention test. In contrast, the distribution curve of the sample 2-17 greatly deviated from the ideal line, because the distribution curve in the vicinity of 3.5 µS to 5 µS were approximately 0, after the thermal acceleration retention test.

Experiment 3

Properties of Storage Device Formed by Combining a Plurality of Transition Metal Elements in Group 4 to 6

A plurality of storage devices (samples 3-1 to 3-4) were fabricated through processing similar to that for the storage devices (samples 1 and 2). In each sample, the ion source layer was made of a combination of transition metal elements in Group 4 to 6 of the Periodic Table. Then, the samples were subjected to the thermal acceleration retention test at 150° C. for one hour, and variations in the conductance values were measured (FIGS. 9A to 9D). Among the samples 3-1 to 3-4, the same lower electrode, resistance change layer, and upper electrode, which were made of TiN, Al (2 nm)-Ox, and W (30 nm), respectively, were used. The compositions of the ion source layers in the individual samples are listed as follows.

(Sample 3-1) TaHfTe—Ox (45 nm)
(Sample 3-2) MoHfTe—Ox (45 nm)
(Sample 3-3) TiHfTe—Ox (45 nm)
(Sample 3-4) NbHfTe—Ox (45 nm)

FIG. 9A to 9D reveal that even when two or more transition metal elements are combined in the ion source layer, as long as they are metal elements in Group 4 to 6 of the Periodic Table, the storage device exhibits an appropriate performance of controlling and retaining the conductance values at both the levels 1 and 2, in comparison with the samples 1-2 and 1-3 made of a material used in existing cases.

Experiment 4

Ratio of Transition Metal Element to Chalcogen Element

The plurality of storage devices 1 were fabricated through processing similar to that for the above storage devices (samples 1 to 3). In these storage devices 1, composition ratios of Zr to Te in ZrTe—Ox constituting the ion source layer 21 were set to 20:80 (sample 4-1), 30:70 (sample 4-2), 50:50 (sample 4-3), 70:30 (sample 4-4), and 80:20 (sample 4-5), respectively. Then, the samples 4-1 to 4-5 were subjected to the thermal acceleration retention test at 150° C. for one hour, and variations in the conductance values were measured. The respective results are shown in FIGS. 10A to 10E. Among the samples 4-1 to 4-5, the same lower electrode 10, resistance change layer 22, and upper electrode 30, which were made of TiN, Al (2 nm)-Ox, and W (30 nm), respectively, were used.

(Sample 4-1) Zr20 Te80-Ox (45 nm)
(Sample 4-2) Zr30 Te70-Ox (45 nm)
(Sample 4-3) Zr50 Te50-Ox (45 nm)
(Sample 4-4) Zr70 Te30-Ox (45 nm)
(Sample 4-5) Zr80 Te20-Ox (45 nm)

It is evident from the samples 4-2 to 4-4 (FIGS. 10B, 10C, and 10D) that the conductance values are not greatly shifted before and after the retention, and therefore are retained appropriately, when a ratio of the transition metal element (Zr) to the chalcogen element (Te) falls within a range of 30:70 to 70:30. As for the sample 4-1 (FIG. 10A) that falls outside the above range, data failed to be written thereto or erased therefrom. A reason for this is considered that the peeling of the film occurred upon device microprocessing after the formation of the storage layer, due to the lowering of the adhesion. Furthermore, the sample 4-5 (FIG. 10E) exhibited an extremely-degraded distribution of conductance values upon the writing operation. A reason for this is considered that the resistance decreases, thereby making it difficult to apply a voltage to the device.

It is evident from the above results that when a ratio of the transition metal element to the chalcogen element in the ion source layer 21 with the exception of oxygen is set so as to fall within a range of 3:7 to 7:3, the appropriate conductance distribution and retention property are provided upon writing operation. Moreover, it is also evident that if a composition ratio of the transition metal element to the chalcogen element in the ion source layer 21 is set so as to fall outside the above range, a disadvantage may occur in that, for example, the adhesion of the storage layer 20 is prominently lowered, or the resistance of the ion source layer is markedly decreased, thus making it difficult to apply a voltage to the device. Hence, in this case, controlling the medium resistance values is hardly possible.

Experiment 5

Content of Oxygen in Ion Source Layer

Samples 5-1 to 5-6 were fabricated in order to determine the content of oxygen in the ion source layer. First, Zr 50% and Te 50% (atomic percent ratio) were subjected to reactive sputtering with an Ar process gas with which oxygen was mixed, thereby forming ZrTeOx layers of approximately 45 nm thick as the ion source layers 21. Further, in the samples 5-1 to 5-6, ZrTeOx layers were formed under the condition that gas flow ratios of Ar (sccm) to oxygen (sccm) were set to 75:0, 75:3, 75:5, 75:7, 75:10, 75:15, and 75:20, respectively. A value of oxygen (sccm)/Ar(sccm) was set to fall within a range of 0 to 0.267. Among the samples 5-1 to 5-6, the same lower electrode 10, resistance change layer 22, and upper electrode 30, which were made of TiN, Al (2 nm)-Ox, and W (30 nm), respectively, were used.

Figure 11:
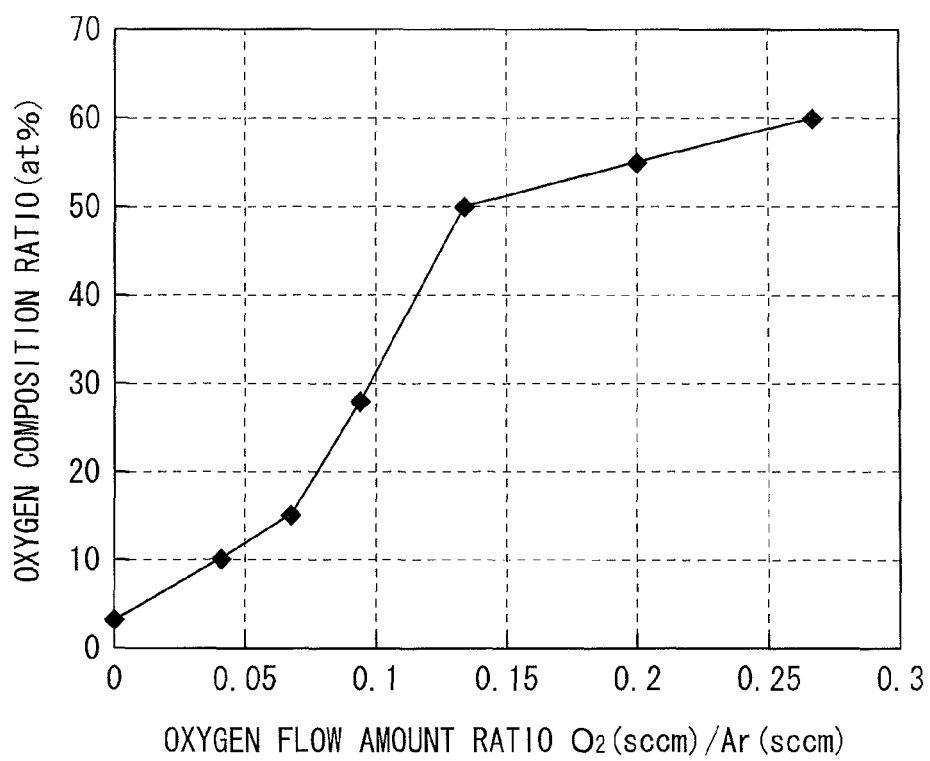
FIG. 11 is a characteristic diagram depicting a relationship between an injection amount of oxygen and a content of oxygen in Experiment 5.

Contents of oxygen in the ion source layers 21 for the samples 5-1 to 5-6 were measured with the RBS, with respect to the gas flow ratio of oxygen (sccm) to Ar (sccm) upon formation of the layers. The results are shown in FIG. 11. For the ion source layer 21 of each sample, the composition of oxygen which was measured with the RBS and the gas flow amount ratio of oxygen (sccm) to Ar (sccm) are listed below. In this case, the measurement with the RBS was made under the following conditions. MC resolution was 4.0 Key/ch; energy resolution was 20 keV; a front aperture diameter of a detector was 5 mm; an incident ion was 4He++; an incident energy was 2.275 MeV; a beam incident angle was 90°; a beam current (sample current) was approximately 20 nA; an incident beam diameter was 2 mm; a sample rotation angle was 45°; a beam irradiation amount was 40 μC; and the degree of vacuum in a sample chamber was approximately 2 to 6 Torr. In addition, the measurement was made by using a back scattering angle of a normal detector angle of 160° and an appropriate grazing detector angle of up to 103°.

(Sample 5-1) O$_2$/Ar=0 ZrTe—O: 3.1%
(Sample 5-2) O$_2$/Ar=0.04 ZrTe—O: 10%
(Sample 5-3) O$_2$/Ar=0.067 ZrTe—O: 15%
(Sample 5-4) O$_2$/Ar=0.093 ZrTe—O: 28%
(Sample 5-5) O$_2$/Ar=0.133 ZrTe—O: 50%
(Sample 5-6) O$_2$/Ar=0.2 ZrTe—O: 55%
(Sample 5-7) O$_2$/Ar=0.267 ZrTe—O: 60%

FIG. 11 reveals that the content of oxygen contained in the ion source layer 21 is changed from 3.1% to 55%, as the ratio of oxygen (sccm) to Ar (sccm) is changed from 0 to 0.2. However, the value 3.1% which the oxygen content indicates when the oxygen (sccm)/Ar (sccm) ratio is 0 may be affected by background noises during the measurement. Accordingly, the actual oxygen content in this case is estimated to be 3.1% or lower. Moreover, respective memory arrays having the compositions of the samples 5-1 to 5-7 were fabricated, and were subjected to the thermal acceleration retention test at 150° C. for one hour. The conductance values of the memory arrays were measured (FIGS. 12A to 12G), and variations in the conductance values of the samples in the thermal acceleration retention test were compared with respect to the contents of oxygen measured with the RBS, The sample 5-1 (FIG. 12A) that had an oxygen content of 3.1% or lower had difficulty equalizing conductance values at both the levels 1 (3 μS) and 2 (10 μS). In addition, the respective conductance values were greatly shifted before and after the thermal acceleration retention test. In contrast, the samples 5-2 to 5-5 (FIG. 12B to 12E) made it possible to nearly equalize the resistance values at both the levels 1 and 2, and the respective conductance values were not greatly shifted before and after the thermal acceleration retention test. Among these samples, in particular, the sample 5-4 (FIG. 12D) which had an oxygen content of 28% exhibited an appropriate result. Specifically, the respective conductance values were hardly shifted at both the levels 1 and 2 before and after the thermal acceleration retention test. The sample 5-6 (FIG. 12F) which had an oxygen content of 55% had difficulty performing a writing operation, because the device resistance was increased due to the increase in the amount of oxygen. However, the respective conductance values were not greatly shifted at both the levels 1 and 2 before and after the thermal acceleration retention test. Therefore, the sample 5-6 is considered to enable multivalued recording. The sample 5-7 (FIG. 12G) which had an oxygen content of 60% failed to perform a writing operation at a necessary conductance value, because the initial resistance value of the device increased dramatically. In consideration of the above result, it is evident that the content of oxygen in the ion source layer 21 of the storage device 1, which enables the medium resistance values to be controlled and retained, is approximately 10% to 55%.

Experiment 6

Material of Resistance Change Layer

The storage devices 1 (samples 6-1 to 6-4) were fabricated through processing similar to that for the sample 1-1. In each of the samples 6-1 to 6-4, Zr50 Te50-Ox was used for the ion source layer 21. Furthermore, in the samples 6-1 to 6-4, HfOx (sample 6-1), MN (sample 6-2), ZrOx (sample 6-3), and YOx (sample 6-4) were used for the resistance change layers 22, respectively, in place of AlOx used in the above samples. The samples 6-1 to 6-4 were subjected to the thermal acceleration retention test at 150° C. for one hour, and variations in conductance values were measured (FIGS. 13A to 13D), similar to Experiments 1 to 4 as described above. FIGS. 13A to 13D reveal that each of the samples 6-1 to 6-4 exhibits an appropriate retention property, because the respective conductance values are not greatly shifted at both the levels 1 and 2 after the thermal acceleration retention test, similar to the results of the above samples according to this embodiment. Therefore, it is obvious that there is no specific limitation on a material of the resistance change layer 22 in the storage device according to the above-described embodiment of the present disclosure, as long as it is an oxide film, nitride film, or oxynitride film of metal elements.

The results of Experiments 1 to 6 demonstrate that it is possible for the storage device that includes the storage layer composed of the resistance change layer and the ion source layer to improve the performances of retaining and controlling medium resistance values between those in the high and low resistance states, independently of a material for the resistance change layer, when a chalcogen element, oxygen, and a metal element in Group 4 to 6 which is included in transition metal elements are used as materials for the ion source layer. With this storage device, the performance of the resistance change multivalued memory is improved, thereby making it possible to provide the resistance change memory (storage unit) with a large capacity. Moreover, when an amount of oxygen in the ion source layer 21 is set so as to fall within a range of 10% to 55% both inclusive, and a ratio of transition metal elements to a chalcogen element is set so as to fall within a range of 3:7 to 7:3, the performance of retaining the medium resistance values are further improved, thereby making it possible to provide the more reliable storage unit.

Up to this point, the example embodiment and Examples of the present disclosure have been described. It is to be noted that the present disclosure is not limited to the above-described embodiment and Examples, and various modifications to the present disclosure may be contemplated.

For example, the configurations of the storage device 1, the storage unit 2, and the memory array have been concretely described in the above-described embodiment and Example. In each configuration, however, all the layers may not be provided, or any other additional layer may be provided. The material of each layer, and the method and condition of forming each layer are not limited to those described in the embodiment and the like. Alternatively, any other material and method may be employed. For example, any given addition element may be used for the ion source layer 21, as long as the element ratio as described above is not changed or the property requested to multivalued memories is not lowered.

The storage device 1 of the above embodiment and the like may employ an inverted structure in which the respective vertical locations of the ion source layer and the resistance change layer are exchanged. Moreover, the storage device 1 may employ a cross-point structure or system with one or more suitable diodes, in order to increase the memory capacity. Alternatively, the multiple memory devices may be stacked vertically. As described above, various known memory structures may be applied to the storage device 1.

Furthermore, the technology encompasses any possible combination of some or all of the various embodiments and the modifications described herein and incorporated herein.

It is possible to achieve at least the following configurations from the above-described example embodiments, the modifications, and Examples of the disclosure.

(1) A storage device, including:
   a first electrode;
   a storage layer including an ion source layer; and
   a second electrode,
   the first electrode, the storage layer, and the second electrode being provided in this order,
   wherein the ion source layer includes a chalcogen element, oxygen, and one or more transition metal elements selected from the group of Groups 4, 5, and 6 elements of the Periodic Table.

(2) The storage device according to (1), wherein an amount of the oxygen included in the ion source layer falls within a range of about 10% to about 55% both inclusive.

(3) The storage device according to (1) or (2), wherein a ratio of the one or more transition metal elements to the chalcogen element included in the ion source layer falls within a range of about 3:7 to about 7:3 both inclusive.

(4) The storage device according to any one of (1) to (3), wherein the one or more transition metal elements are selected from the group of titanium, zirconium, and hafnium.

(5) The storage device according to any one of (1) to (4), wherein the storage layer includes a resistance change layer, the resistance change layer being provided nearer to the first electrode than the second electrode, and including one of a metal oxide film, a metal nitride film, and a metal oxynitride film.

(6) The storage device according to any one of (1) to (5), wherein
   the storage layer includes a resistance change layer, and
   the resistance change layer has a resistance that varies in response to formation of a low resistance portion, the low resistance portion being formed in the resistance change layer upon application of a voltage between the first electrode and the second electrode, and containing the one or more transition metal elements or an oxygen vacancy.

(7) The storage device according to any one of (1) to (6), wherein the ion source layer is free from copper and aluminum.

(8) A storage unit with a plurality of storage devices and a pulse application section, the pulse application section selectively applying a pulse voltage or supplying pulse currents to the storage devices, the storage devices each including:
   a first electrode;
   a storage layer including an ion source layer; and
   a second electrode,
   the first electrode, the storage layer, and the second electrode being provided in this order,
   wherein the ion source layer includes a chalcogen element, oxygen, and one or more transition metal elements selected from the group of Groups 4, 5, and 6 elements of the Periodic Table.

The present disclosure contains subject matter related to that disclosed in Japanese Priority Patent Application JP 2012-080643 filed in the Japan Patent Office on Mar. 30, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device, comprising:
   a first electrode;
   a storage layer including an ion source layer and a resistance change layer; and
   a second electrode,
   the first electrode, the storage layer, and the second electrode being provided in this order,
   wherein the ion source layer includes a chalcogen element, oxygen, and one or more metal elements selected only from the group consisting of Groups 4, 5, and 6 elements of the Periodic Table, and
   wherein the ion source layer which provides metal ions to the resistance change layer does not include metal elements selected from groups other than Group 4, 5, and 6 elements of the Periodic Table.

2. The storage device according to claim 1, wherein an amount of the oxygen included in the ion source layer falls within a range of about 10% to about 55% both inclusive.

3. The storage device according to claim 1, wherein a ratio of the one or more metal elements to the chalcogen element included in the ion source layer falls within a range of about 3:7 to about 7:3 both inclusive.

4. The storage device according to claim 1, wherein the one or more metal elements are selected from the group consisting of titanium, zirconium, and hafnium.

5. The storage device according to claim 1, wherein the resistance change layer is provided nearer to the first electrode than the second electrode, and including one of a metal oxide film, a metal nitride film, and a metal oxynitride film.

6. The storage device according to claim 1, wherein the resistance change layer has a resistance that varies in response to formation of a low resistance portion, the low resistance portion being formed in the resistance change layer upon application of a voltage between the first electrode and the second electrode, and containing the one or more metal elements or an oxygen vacancy.

7. A storage unit with a plurality of storage devices and a pulse application section, the pulse application section selectively applying a pulse voltage or supplying pulse currents to the plurality of storage devices, the plurality of storage devices each comprising:
a first electrode;
a storage layer including an ion source layer and a resistance change layer; and
a second electrode,
the first electrode, the storage layer, and the second electrode being provided in this order,
wherein the ion source layer includes a chalcogen element, oxygen, and one or more metal elements selected only from the group consisting of Groups 4, 5, and 6 elements of the Periodic Table, and
wherein the ion source layer which provides metal ions to the resistance change layer does not include metal elements selected from groups other than Group 4, 5, and 6 elements of the Periodic Table.

8. The storage unit according to claim 7, wherein an amount of the oxygen included in the ion source layer falls within a range of about 10% to about 55% both inclusive.

9. The storage unit according to claim 7, wherein a ratio of the one or more metal elements to the chalcogen element included in the ion source layer falls within a range of about 3:7 to about 7:3 both inclusive.

10. The storage unit according to claim 7, wherein the one or more metal elements are selected from the group consisting of titanium, zirconium, and hafnium.

11. The storage unit according to claim 7, wherein the resistance change layer is provided nearer to the first electrode than the second electrode, and including one of a metal oxide film, a metal nitride film, and a metal oxynitride film.

12. The storage unit according to claim 7, wherein the resistance change layer has a resistance that varies in response to formation of a low resistance portion, the low resistance portion being formed in the resistance change layer upon application of a voltage between the first electrode and the second electrode, and containing the one or more metal elements or an oxygen vacancy.

* * * * *